(12) United States Patent
Negley

(10) Patent No.: US 7,591,702 B2
(45) Date of Patent: Sep. 22, 2009

(54) METHODS OF MANUFACTURING SEMICONDUCTOR LIGHT EMITTING DEVICES INCLUDING PATTERNABLE FILMS COMPRISING PHOSPHOR

(75) Inventor: Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/944,804

(22) Filed: Nov. 26, 2007

(65) Prior Publication Data

US 2008/0076316 A1 Mar. 27, 2008

Related U.S. Application Data

(62) Division of application No. 10/947,704, filed on Sep. 23, 2004, now Pat. No. 7,372,198.

(51) Int. Cl.
*H01L 21/56* (2006.01)
(52) U.S. Cl. .................. 445/58; 313/499; 313/498
(58) Field of Classification Search .......... 362/555, 362/800, 84, 612; 313/498–512; 345/36, 345/45, 76; 315/169.3; 257/88–99; 445/58
See application file for complete search history.

(56) References Cited

U.S. PATENT DOCUMENTS

| | | | |
|---|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,277,840 A | 1/1994 | Osaka et al. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |

(Continued)

FOREIGN PATENT DOCUMENTS

EP  1 198 016 A2  4/2002

(Continued)

OTHER PUBLICATIONS

Dow Corning Corporation, *Information About Dow Corning® Brand Low-Stress Patternable Silicone Materials*, Form No. 11-1108-01, 2003.

(Continued)

*Primary Examiner*—Nimeshkumar D. Patel
*Assistant Examiner*—Christopher M Raabe
(74) *Attorney, Agent, or Firm*—Myers Bigel Sibley & Sajovec, P.A.

(57) ABSTRACT

Semiconductor light emitting devices include a semiconductor light emitting element having a light emitting surface, and a patternable film including transparent silicone and phosphor on at least a portion of the light emitting surface. The patternable film may be a photopatternable film and/or a printable film including transparent silicone and phosphor. The patternable film includes an aperture therein that exposes a portion of a light emitting surface, and a bond pad is provided on the light emitting surface in the aperture. A wire bond may be provided on the bond pad. Related methods of fabricating semiconductor light emitting devices are also provided.

19 Claims, 2 Drawing Sheets

U.S. PATENT DOCUMENTS

| | | |
|---|---|---|
| 5,813,753 A | 9/1998 | Vriens et al. |
| 5,858,278 A | 1/1999 | Itoh et al. |
| 5,912,477 A | 6/1999 | Negley |
| 6,069,440 A | 5/2000 | Shimizu et al. |
| 6,201,262 B1 | 3/2001 | Edmond et al. |
| 6,252,254 B1 | 6/2001 | Soules et al. |
| 6,366,018 B1 | 4/2002 | Garbuzov et al. |
| 6,395,564 B1 | 5/2002 | Huang |
| 6,603,146 B1 | 8/2003 | Hata et al. |
| 6,635,363 B1 | 10/2003 | Duclos et al. |
| 6,642,652 B2 | 11/2003 | Collins, III et al. |
| 6,747,406 B1 | 6/2004 | Bortscheller et al. |
| 6,791,116 B2 | 9/2004 | Takahashi et al. |
| 7,075,116 B2 | 7/2006 | Okazaki |
| 2002/0015013 A1 | 2/2002 | Ragle |
| 2002/0123164 A1 | 9/2002 | Slater, Jr. et al. |
| 2003/0006418 A1 | 1/2003 | Emerson et al. |
| 2003/0080341 A1 | 5/2003 | Sakano et al. |
| 2004/0056260 A1 | 3/2004 | Slater, Jr. et al. |
| 2004/0256974 A1 | 12/2004 | Mueller-Mach et al. |

FOREIGN PATENT DOCUMENTS

| | | |
|---|---|---|
| JP | 2004-228464 | 8/2004 |

OTHER PUBLICATIONS

Haberern et al., *Light Emitting Devices Having Reflective Bond Pad and Methods of Fabricating Light Emitting Devices Having Reflective Bond Pads,* U.S. Appl. No. 10/899,793, filed Jul. 27, 2004.

Invitation to Pay Additional Fees, PCT Application No. PCT/US2005/023874, Dec. 12, 2005.

METHODS OF MANUFACTURING SEMICONDUCTOR LIGHT EMITTING DEVICES INCLUDING PATTERNABLE FILMS COMPRISING PHOSPHOR

CROSS-REFERENCE TO RELATED APPLICATION

This application is a divisional of application Ser. No. 10/947,704, filed Sep. 23, 2004, now U.S. Pat. No. 7,372,198 entitled Semiconductor Light Emitting Devices Including Patternable Films Comprising Transparent Silicone and Phosphor, assigned to the assignee of the present application, the disclosure of which is hereby incorporated herein by reference in its entirety as if set forth fully herein.

FIELD OF THE INVENTION

This invention relates to microelectronic devices and fabrication methods therefor, and more particularly to semiconductor light emitting devices and fabrication methods therefor.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. It is also known that a semiconductor light emitting device generally is packaged to provide external electrical connections, heat sinking, lenses or waveguides, environmental protection and/or other functions.

Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

It may be desirable to provide a phosphor for an LED, for example to provide solid-state lighting. In one example, LEDs that are used for solid-state white lighting may produce high radiant flux output at short wavelengths, for example in the range of about 380 nm to about 480 nm. One or more phosphors may be provided, wherein the short wavelength, high energy photon output of the LED is used to excite the phosphor, in part or entirely, to thereby down-convert in frequency some or all of the LED's output to create the appearance of white light.

As one specific example, ultraviolet output from an LED at about 390 nm may be used in conjunction with red, green and blue phosphors, to create the appearance of white light. As another specific example, blue light output at about 470 nm from an LED may be used to excite a yellow phosphor, to create the appearance of white light by transmitting some of the 470 nm blue output along with some secondary yellow emission occurring when part of the LEDs output is absorbed by the phosphor.

As is well known to those having skill in the art, at least two techniques may be used to incorporate phosphor material into a light emission path of an LED. In one technique, the phosphor may be suspended in the packaging and/or encapsulation that is provided with the LED, so that the phosphor is maintained in proximity to the LED. In an alternative approach, the phosphor material is coated on the LED itself. When coating a phosphor, a liquid binder, such as an epoxy, may be used, in which one or more phosphors is suspended. The phosphor-containing binder may be dispensed onto the LED prior to dispensing and curing a clear encapsulation epoxy. LEDs that employ phosphor coatings are described, for example, in U.S. Pat. Nos. 6,252,254; 6,069,440; 5,858,278; 5,813,753; and 5,277,840. Moreover, published United States Patent Application No. US 2004/0056260 A1, published on Mar. 25, 2004, entitled Phosphor-Coated Light Emitting Diodes Including Tapered Sidewalls, and Fabrication Methods Therefor, the disclosure of which is hereby incorporated herein by reference in its entirety as if set forth fully herein, describes a light emitting diode that includes a substrate having first and second opposing faces and a sidewall between the first and second opposing faces that extends at an oblique angle from the second face towards the first face. A conformal phosphor layer is provided on the oblique sidewall. The oblique sidewall can allow more uniform phosphor coatings than conventional orthogonal sidewalls.

SUMMARY OF THE INVENTION

Semiconductor light emitting devices according to embodiments of the present invention include a semiconductor light emitting element that includes a light emitting surface, and a patternable film comprising transparent silicone and phosphor on at least a portion of the light emitting surface. The patternable film comprising transparent silicone and phosphor may be a photopatternable film and/or a printable film comprising transparent silicone and phosphor. In some embodiments, the patternable film comprising transparent silicone and phosphor includes an aperture therein that exposes a light emitting surface, and a bond pad is provided on the light emitting surface in the aperture. In other embodiments, a wire bond is provided on the bond pad opposite the light emitting surface.

In still other embodiments, the light emitting surface includes a face and a sidewall that extends from the face, and the patternable film comprising transparent silicone and phosphor is on at least a portion of the face and on at least a portion of the sidewall. Moreover, in some embodiments, the patternable film comprising transparent silicone and phosphor is thicker, and in some embodiments at least 10% thicker, on at least a portion of the sidewall than on at least a portion of the face.

In yet other embodiments, the phosphor is configured to convert at least some light that is emitted from the light emitting surface, such that light that emerges from the semiconductor light emitting device appears as white light. In other embodiments, a patternable film comprising transparent silicone and free of phosphor is provided between the light emitting surface and the transparent patternable film comprising silicone and phosphor.

In yet other embodiments of the present invention, a second semiconductor light emitting element is monolithically integrated with a first semiconductor light emitting element, and the patternable film comprising transparent silicone and phosphor is provided on at least a portion of the light emitting surfaces of both the first and second monolithically integrated semiconductor light emitting elements. In still other embodiments, first and second semiconductor light emitting elements are provided on a mounting tape and spaced apart from one another, and the patternable film comprising transparent silicone and phosphor is provided on at least a portion of the light emitting surfaces of both the first and second semiconductor light emitting elements. In other embodiments, the patternable film comprising transparent silicone and phosphor also extends onto the mounting tape between the spaced apart first and second light emitting devices. In still other embodiments, the light emitting surfaces include sidewalls facing one another, and the patternable film comprising transparent silicone and phosphor extends onto at least a portion of the face and sidewalls.

In still other embodiments of the present invention, multiple layers of patternable films comprising transparent silicone and phosphor may be provided on at least a portion of the light emitting surface. In some embodiments, the phosphors in the various layers may be the same. However, in other embodiments, a first phosphor may be provided in a first film and a second phosphor may be provided in a second film. For example, the first phosphor may be a green phosphor, and the second phosphor may be a red phosphor. Yet other combinations of two or more patternable films also may be provided.

Semiconductor light emitting devices may be fabricated, according to various embodiments of the present invention, by coating a patternable film comprising transparent silicone and phosphor on at least a portion of a light emitting surface of a semiconductor light emitting element. In some embodiments, a photopatternable film comprising transparent silicone and phosphor is coated on at least a portion of the light emitting surface of a semiconductor light emitting diode. In other embodiments, a printable film comprising transparent silicone and phosphor is printed on at least a portion of a light emitting surface of a semiconductor light emitting element. In some embodiments, the photopatternable film comprising transparent silicone and phosphor is photopatterned to form an aperture therein that exposes a light emitting surface. In other embodiments, the printable film comprising transparent silicone and phosphor is printed on at least a portion of the light emitting surface of the semiconductor light emitting element, to define an aperture therein that exposes the light emitting surface. In yet other embodiments, a bond pad is formed on the light emitting surface of the aperture, and, in still other embodiments, a wire is bonded to the bond pad opposite the light emitting surface.

In some embodiments, coating is performed such that the patternable film comprising transparent silicone and phosphor is coated on at least a portion of the face of the light emitting surface and on at least a portion of a sidewall thereof. In some embodiments the coating is thicker, and, in some embodiments, at least 10% thicker, on at least a portion of the sidewall than on at least a portion of the face.

In some embodiments of the invention, photopatterning is performed by selectively exposing the photopatternable film comprising transparent silicone and phosphor to define the aperture, and then developing the photopatternable film comprising transparent silicone and phosphor that has been exposed, to form the aperture. In still other embodiments, the photopatternable film comprising transparent silicone and phosphor is again developed to enlarge the aperture. In yet other embodiments, light emission of a light emitting device is measured after developing the photopatternable film comprising transparent silicone, and phosphor and a second development is performed if the light emission of the light emitting device that is measured does not conform to at least one predefined parameter, such as an emission frequency spectrum. In still other embodiments, a photopatternable film comprising transparent silicone and free of phosphor may be coated on at least a portion of the light emitting surface prior to coating the photopatternable film comprising transparent silicone and phosphor.

Method embodiments of the present invention also may be used to coat multiple semiconductor light emitting elements. In some embodiments, the patternable film comprising transparent silicone and phosphor is coated on at least a portion of multiple semiconductor light emitting elements that are monolithically integrated. In other embodiments a plurality of semiconductor light emitting devices are mounted on a mounting tape, and the multiple semiconductor light emitting devices on a mounting tape are then coated. In still other embodiments, the mounting tape is stretched prior to coating to define spaces between adjacent devices, and then coating is performed on the devices and on the spaces therebetween. In yet other embodiments, sidewalls of the devices also are coated.

Yet other method embodiments of the present invention may coat more than one patternable film comprising transparent silicon and phosphor on at least a portion of the light emitting surface. In particular, in some embodiments, a patternable film comprising transparent silicone and a first phosphor is first coated on the light emitting surface. Then, a second patternable film comprising transparent silicone and a second phosphor is coated on the first patternable film comprising transparent silicone and a first phosphor. In some embodiments, the first phosphor is a green phosphor and the second phosphor is a red phosphor. Yet other combinations of two or more patternable films also may be provided.

DETAILED DESCRIPTION

Figure 1:
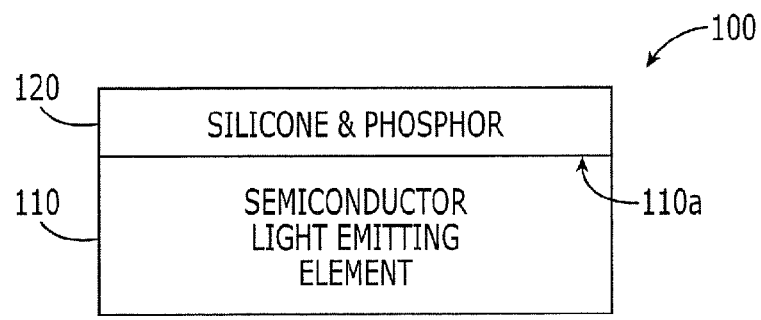
FIGS. 1-6 are cross-sectional views of semiconductor light emitting devices according to various embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention. Moreover, terms such as "horizontal", "vertical" and "perpendicular" indicate general directions or relationships rather than precise 0° or 90° orientations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor light emitting device according to various embodiments of the present invention. Referring now to FIG. 1, a semiconductor light emitting device 100 according to various embodiments of the present invention includes a semiconductor light emitting element 110 that includes a light emitting surface 110a. A patternable film comprising transparent silicone and phosphor 120 is provided on at least a portion of the light emitting surface 110a. As used herein, "light" refers to any radiation, visible and/or invisible (such as ultraviolet) that is emitted by a semiconductor light emitting element 110. Moreover, as used herein, the term "transparent" means that at least some optical radiation that enters the patternable film comprising transparent silicone and phosphor 120 is emitted from the film 120.

Patternable films comprising transparent silicone are well known to those having skill in the art. For example, Dow Corning® markets a series of low stress patternable silicone materials, designated as Dow Corning WL-3010 Printable Silicone and Dow Corning WL-5000 series Photopatternable Spin-On Silicones. Dow Corning WL-3010 Printable Silicone is a stencil-printable paste material designed to provide a low stress, low-temperature-curable patterned silicone for a variety of microelectronics applications. Although Dow Corning WL-3010 paste material is black, transparent paste also may be provided and/or the paste may become transparent after curing. Dow Corning WL-5000 series Photopatternable Spin-On Silicones include WL-5150, WL-5350 and WL-5351 Photopatternable Spin-On Silicones, that are designed to provide low stress, low temperature-curable transparent patterned films for a variety of micro- and optoelectronics applications. As noted in a product information brochure entitled "Information About Dow Corning® Brand Low-Stress Patternable Silicone Materials", form no. 11-1108-01, copyright Dow Corning Corporation, 2003, these materials may have potential uses such as high-volume wafer level or other integrated circuit packaging applications; wafers, films, ceramics and laminates; stress-buffer layer applications; emerging applications using lead-free solder; front and backside wafer protective layers; redistribution layers; solder masks; negative photoresists; adhesive layers and sacrificial layers.

Phosphors also are well known to those having skill in the art. As used herein, the phosphor may be Cerium-doped Yttrium Aluminum Garnet (YAG:Ce) and/or other conventional phosphors and may be mixed into a paste or solution of transparent patternable film comprising silicone using conventional mixing techniques, to thereby provide the transparent patternable film comprising silicone and phosphor 120. In some embodiments, the phosphor is configured to convert at least some light that is emitted from the light emitting surface 110a such that light that emerges from the semiconductor light emitting device 100 appears as white light.

The semiconductor light emitting element 110 may include a light emitting diode, a laser diode and/or other semiconductor device that includes one or more semiconductor layers, which may include silicon, silicon carbide, gallium nitride and/or other semiconductor materials, a substrate which may include sapphire, silicon, silicon carbide and/or other microelectronic substrates, and one or more contact layers, which may include metal and/or other conductive layers. In some embodiments, ultraviolet, blue and/or green LEDs may be provided. The design and fabrication of semiconductor light emitting devices are well known to those having skill in the art and need not be described in detail herein.

For example, light emitting devices according to some embodiments of the present invention may include structures such as the gallium nitride-based LED and/or laser structures fabricated on a silicon carbide substrate, such as those devices manufactured and sold by Cree, Inc. of Durham, N.C. The present invention may be suitable for use with LED and/or laser structures that provide active regions such as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference in their entirety as if set forth fully herein. Other suitable LED and/or laser structures are described in published U.S. Patent Application Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Application Publication No. US 2002/0123164 A1 entitled Light Emitting Diodes Including Modifications for Light Extraction and Manufacturing Methods Therefor, the disclosures of which are hereby incorporated herein by reference in their entirety as if set forth fully herein. Furthermore, phosphor coated LEDs, such as those described in U.S. Patent Application Publication 2004/0056260 A1, entitled Phosphor-Coated Light Emitting Diodes Including Tapered Sidewalls and Fabrication Methods Therefor, published Mar. 25, 2004, the disclosure of which is incorporated by reference herein as if set forth fully, may also be suitable for use in some embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Application Publication No. US 2002/0123164 A1.

Figure 2:
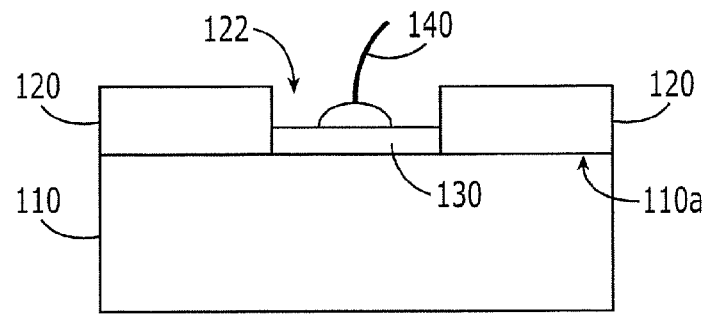

FIG. 2 is a cross-sectional view of semiconductor light emitting devices according to other embodiments of the present invention. As shown in FIG. 2, the patternable film comprising transparent silicone and phosphor 120 includes an aperture 122 therein that exposes a portion of the light emitting surface 110a. When a photopatternable film is used, photolithography including exposure and development may be used to define the aperture, as will be described in detail below. In contrast, when a printable film is used, screen or stencil printing may be used to define the aperture while coating the printable film.

Still referring to FIG. 2, a bond pad 130 is provided on the light emitting surface 110a in the aperture 122. As also shown, in some embodiments of the present invention, a wire bond 140 is provided on the bond pad 130 opposite the light emitting surface 110a. Bond pads and wire bonds are well known to those having skill in the art and need not be described further herein. One example of bond pads and wire bonds is described in application Ser. No. 10/899,793, filed Jul. 27, 2004, entitled Light Emitting Devices Having A Reflective Bond Pad And Methods Of Fabricating Light Emitting Devices Having Reflective Bond Pads, assigned to the assignee of the present application, the disclosure of which is hereby incorporated herein by reference in its entirety as if set forth fully herein.

Accordingly, embodiments of the present invention can allow a phosphor to be coated on a semiconductor light emitting element prior to fabricating a bond pad and performing wire bonding. The patternable film comprising transparent silicone can be patterned using conventional printing or photolithographic techniques and can remain transparent even when exposed to the relatively high temperatures, such as temperatures of about 280° C. or more that are used to fabricate a bond pad and perform a wire bond. Thus, by coating a semiconductor light emitting element with a patternable film comprising transparent silicone and phosphor according to some embodiments of the present invention, a layer of phosphor with a desired thickness and desired characteristics may be provided on a semiconductor light emitting element prior to fabricating a bond pad. This may allow the bond pad and wire bonding to take place without significantly degrading the operational characteristics of the semiconductor light emitting device.

Figure 3:
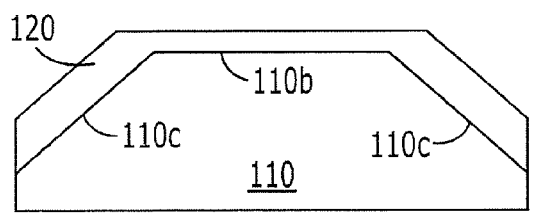

FIG. 3 is a cross-sectional view of semiconductor light emitting devices according to other embodiments of the present invention. As shown in FIG. 3, the light emitting surface includes a face 110b and at least one sidewall 110c that extends from the face 110b. The patternable film comprising transparent silicone and phosphor 120 is on at least a portion of the face 110b and on at least a portion of the sidewall 110c. Moreover, as also shown in FIG. 3, in some embodiments of the present invention, the patternable film comprising transparent silicone and phosphor 120 is thicker on at least a portion of the sidewall 110c than on at least a portion of the face 110b. Thicker sidewall coatings thereby may be provided.

In fact, in some embodiments, the patternable film comprising silicone and phosphor is at least 10% thicker on at least a portion of the sidewall 110c than on at least a portion of the face 110b. Accordingly, some embodiments of the present invention can provide phosphor-coated light emitting devices including tapered sidewalls, wherein the coating can be thicker on the sidewalls 110c compared to the face 110b of the light emitting element. This may contrast sharply with conventional light emitting devices, such as described in U.S. Pat. No. 6,642,652 to Collins III et al., in which variations in thickness of a phosphor coating are less than or equal to 10% of the average thickness. Heavily coated sidewall coatings thereby may be provided according to these embodiments of the present invention.

Figure 4:
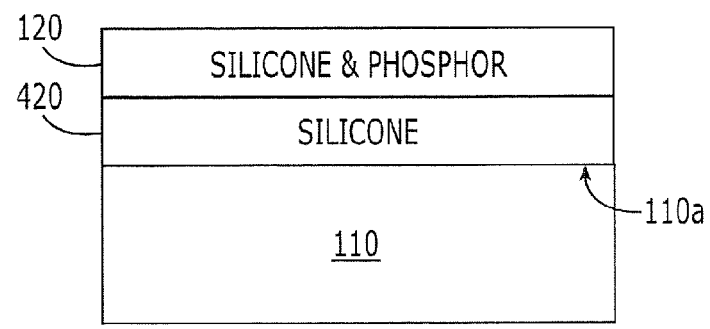

FIG. 4 is a cross-sectional view of semiconductor light emitting devices according to yet other embodiments of the present invention. As shown in FIG. 4, a patternable film comprising transparent silicone and free of phosphor 420 is provided between the light emitting surface 110a and the patternable film comprising transparent silicone and phosphor 120. In some embodiments, the film 420 may be provided by using any of the above-described Dow Corning brand low stress patternable silicone materials, without mixing phosphor therein. It will be understood, however, that other transparent patternable materials may be used and that other materials may be mixed in film 420 to provide light-scattering and/or other properties. Moreover, the same transparent patternable silicon material need not be used for films 120 and 420.

Figure 5:
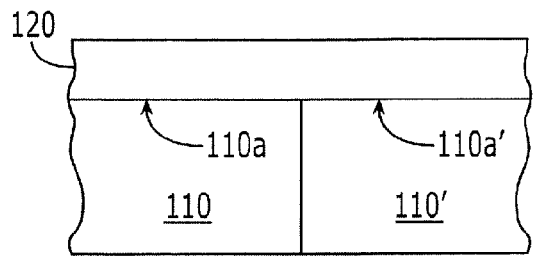

FIG. 5 is a cross-sectional view of semiconductor light emitting devices according to other embodiments of the present invention. As shown in FIG. 5, a first semiconductor light emitting element 110 and a second semiconductor light emitting element 110' are monolithically integrated, for example, by forming multiple semiconductor light emitting elements in a wafer in a conventional manner. The first semiconductor light emitting element 110 includes a first light emitting surface 110a and the second semiconductor light emitting element 110' includes a second light emitting surface 110a'. As shown in FIG. 5, the patternable film comprising transparent silicone and phosphor 120 is provided on at least a portion of both the first and second light emitting surfaces 110a, 110a'.

Figure 6:
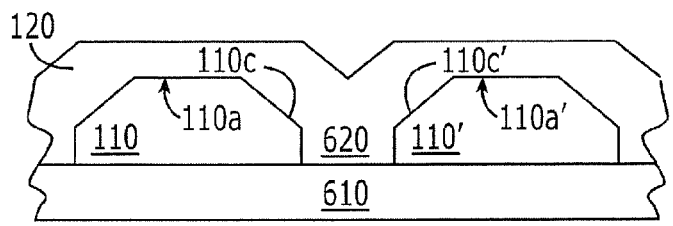

FIG. 6 is a cross-sectional view of semiconductor light emitting devices according to yet other embodiments of the present invention. In FIG. 6, first and second semiconductor light emitting elements 110 and 110' are mounted on a mounting tape 610. The mounting tape 610 may be a conventional "blue tape" that is conventionally used to hold diced semiconductor light emitting elements. As shown in FIG. 6, the patternable film comprising transparent silicone and phosphor 120 is on at least a portion of the first and second light emitting surfaces 110a and 110a', respectively. Moreover, as shown in FIG. 6, in some embodiments of the present invention, the first and second light emitting elements 110 and 110' are spaced apart from one another on the mounting tape 610, for example, by stretching the mounting tape 610 after the semiconductor light emitting elements 110, 110' are mounted thereon, to define a space 620 therebetween. The photopatternable film comprising transparent silicone and phosphor 120 extends onto the mounting tape 610 on the space 620 between the spaced apart first and second light emitting elements 110, 110'.

Moreover, as also shown in FIG. 6, in yet other embodiments, the first light emitting surface 110a includes a first sidewall 110c facing the second semiconductor light emitting element 110', and the second light emitting surface 110a' includes a second sidewall 110c' facing the first semiconductor light emitting element 110. The patternable film comprising transparent silicone and phosphor 120 extends onto at least a portion of the first and second sidewalls 110c and 110c'. Thus, after dicing the individual light emitting devices 110, 110' and stretching the mounting tape 610, some embodiments of FIG. 6 can produce embodiments of FIG. 3, where the coating 120 is thicker on the sidewalls 110c than on the face 110b.

It will be understood by those having skill in the art that embodiments of FIGS. 1-6 may be provided in various combinations and subcombinations according to various other embodiments of the present invention.

Methods of fabricating semiconductor light emitting devices according to various embodiments of the present invention now will be described. For example, referring to FIGS. 1 and 7, a semiconductor light emitting device 100 may be fabricated by coating a patternable film comprising transparent silicone and phosphor 120 on at least a portion of a light emitting surface 110a of a semiconductor light emitting element 110, as shown at Block 710 of FIG. 7. In some embodiments of the invention, where the patternable film comprising transparent silicone and phosphor 120 is a printable film comprising silicone and phosphor, coating at Block 710 may be performed by stencil printing or screen printing equipment. Moreover, in embodiments of the invention where the patternable film comprising transparent silicone and phosphor 120 is a photopatternable film comprising silicone and phosphor, coating at Block 710 may be performed by, for example, spin-coating the photopatternable film comprising transparent silicone and phosphor.

Referring again to Block 710, according to other embodiments of the present invention, prior to coating the patternable film comprising transparent silicone and phosphor 120 on at least a portion of the light emitting surface of the semiconductor light emitting element at Block 710, at least a portion of the light emitting surface may be coated with a patternable film comprising transparent silicone and free of phosphor, for example as shown at 420 of FIG. 4. Coating of Block 710 then may be performed.

Figure 7:
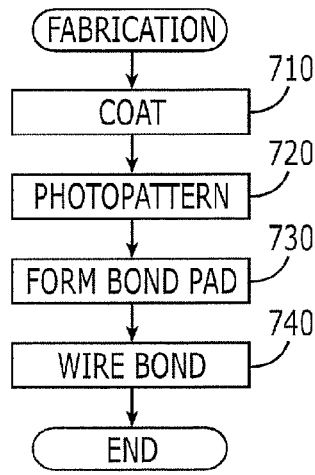
FIGS. 7-9 are flowcharts illustrating manufacturing methods for semiconductor light emitting devices according to various embodiments of the present invention.

Referring to Block 720 of FIG. 7 and to FIG. 2, if transparent photopatternable film is used, the photopatternable film comprising transparent silicone and phosphor 120 may be photopatterned to form an aperture 122 therein that exposes the light emitting surface 110a. When a printable film comprising transparent silicone and phosphor is used, the screen- or stencil-printing itself may be used to define the aperture 122, and photopatterning of Block 720 need not be performed. It will also be understood that if operations of Blocks 710 and 720 are being performed at the wafer level, these operations also may be used to define and provide dicing streets for dicing the wafer.

Referring now to Block 730 of FIG. 7 and again to FIG. 2, a bond pad 130 may be formed on the light emitting surface 110a in the aperture 122. Finally, at Block 740, a wire bond 140 may be bonded to the bond pad 130 opposite the light emitting surface 110a.

Referring again to Block 710 of FIG. 7 and to FIGS. 3 and 6, coating may be performed so as to coat the patternable film comprising transparent silicone and phosphor 120 on at least a portion of the face 110a, 110a' and on at least a portion of the sidewall 110c, 110c'. As shown, for example, in FIG. 6, these embodiments may provide a patternable film comprising transparent silicone and phosphor 120 that is thicker on at least a portion of the sidewall 110c, 110c', and, in some embodiments, at least 10% thicker, than on at least a portion of the face 110a, 110a'.

Figure 8:
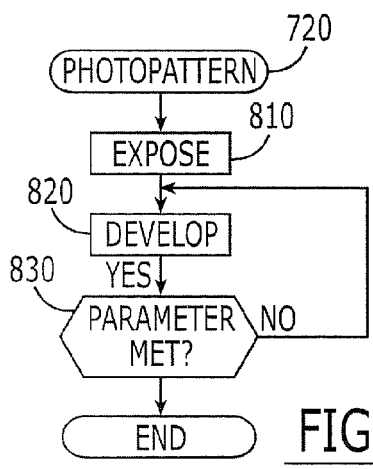

FIG. 8 is a flowchart that illustrates operations for photopatterning according to various embodiments of the present invention, which may correspond to Block 720 of FIG. 7 when a transparent photopatternable film is used. In particular, referring to FIG. 8, at Block 810, the photopatternable film comprising transparent silicone and phosphor 120 is selectively exposed to define an aperture, such as the aperture 122 of FIG. 2. Then, at Block 820, the photopatternable film comprising transparent silicone and phosphor, that has been exposed, is developed (rinsed) to form the aperture 122. Exposure and development may take place as described in the above-cited "Information About Dow Corning® Brand Low-Stress Patternable Silicone Materials", or using other conventional techniques. Referring again to FIG. 8, at Block 830, the light emission of the light emitting device is measured and it is determined whether the light emitting device that is measured conforms to at least one predefined parameter, such as a desired emission frequency spectrum. If yes, photopatterning ends. If not, the photopatternable film comprising transparent silicone and phosphor is again developed (rinsed) at Block 820 to enlarge the aperture.

Embodiments of the present invention that include Block 830 may arise from a recognition that a single development step may not fully develop (wash away) unpatterned portions of the photopatternable film comprising transparent silicone and phosphor. Accordingly, if the light emission spectrum is not satisfactory, a controlled additional amount of the film, including the phosphor therein, may be removed by performing a second or subsequent development. Accordingly, individual semiconductor light emitting devices may be "trimmed" to meet a desired optical emission parameter.

Operations of FIGS. 7 and 8 may be performed on an individual semiconductor light emitting device or on a plurality of semiconductor light emitting devices, either prior to or after dicing. For example, embodiments of FIG. 5 may be fabricated according to embodiments of Block 710 of FIG. 7 by coating a patternable film comprising transparent silicone and phosphor 120 on at least a portion of light emitting surfaces of a plurality of semiconductor light emitting elements that are monolithically integrated. Thus, in some embodiments, coating and/or other operations of FIG. 7 may be performed at the wafer stage prior to dicing.

Figure 9:
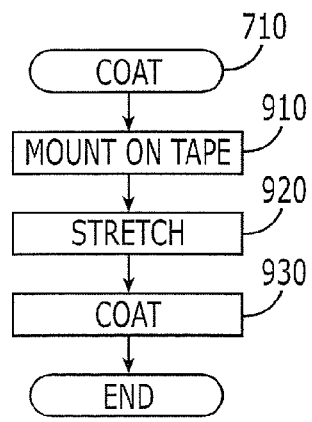

FIG. 9 is a flowchart of other operations that may be performed to coat, which may correspond to Block 710 of FIG. 7, according to other embodiments of the present invention. These embodiments also may correspond to devices of FIG. 6.

In particular, referring to FIG. 9, at Block 910, a plurality of semiconductor light emitting devices are mounted on a mounting tape 610 such as conventional "blue tape." These devices may be singulated devices from a wafer, or a wafer may be singulated after mounting on the mounting tape 610. Optionally, as shown in Block 920, if it is desired to thickly coat the sidewalls of the devices, the mounting tape 610 may be stretched to space apart the devices. In other embodiments, the devices may be placed on the mounting tape 610 in spaced apart relation. In yet other embodiments, the sidewalls may be coated without the need to space apart the devices.

Then, at Block 930, a patternable film comprising transparent silicone and phosphor 120 is formed on at least a portion of the light emitting surfaces 110a, 110a' of the plurality of semiconductor light emitting elements 110, 110' that are mounted on the mounting tape 610. In some embodiments of Block 930, the patternable film comprising transparent silicone and phosphor 120 is also coated on the mounting tape 610 in the spaces 620 between adjacent semiconductor light emitting devices 110, 110', as shown in FIG. 6. Moreover, in yet other embodiments at least a portion of the sidewalls 110c, 110c' are also coated with the photopatternable film comprising transparent silicone and phosphor 120.

Embodiments of the present invention that were described above in connection with FIGS. 1-9 have described a single patternable film comprising transparent silicone and phosphor. However, any of these embodiments may also employ two or more patternable films comprising transparent silicone and phosphor. Thus, in some embodiments of the present invention, a first patternable film comprising transparent silicone and a first phosphor is provided or coated on at least a portion of the light emitting surface of a semiconductor light emitting element. A second patternable film comprising transparent silicone and a second phosphor is then provided or coated on the first patternable film comprising transparent silicone and a first phosphor, opposite the light emitting surface. Three or more layers of patternable film comprising transparent silicone and phosphor also may be provided.

The phosphors in two or more of these multiple layers may be identical or may be different. Thus, for example, a blue semiconductor light emitting device may be provided by providing a first patternable film comprising transparent silicone and green phosphor, and a second patternable film comprising transparent silicone and red phosphor on the first patternable film comprising transparent silicone and green phosphor. In other embodiments, an ultraviolet semiconductor light emitting element may be provided with separate patternable films that comprise transparent silicone and red, green and blue phosphors, respectively.

Moreover, in some embodiments, due to the competing absorption and emission processes, it may be desirable for the light emitting surface to excite the higher energy (emission) phosphors before the lower energy (emission) phosphors. Accordingly, in some embodiments of the present invention, a blue semiconductor light emitting element may be provided with a first patternable film comprising transparent silicone and green phosphor and a second patternable film comprising transparent silicone and red phosphor, so that the blue light that is emitted from the light emitting surface first interacts with the green phosphor and then interacts with the red phosphor. Separate cure and develop processes may be performed on an underlying patternable film prior to forming an overlying patternable film. Alternatively, a common cure and develop process may be performed.

Additional discussion of various embodiments of the present invention now will be provided. In particular, some embodiments of the present invention allow patternable films comprising transparent silicone to be used to add phosphor to a light emitting element. Photopatternable material can be patterned with ultraviolet light just like a photoresist material and behaves as a negative patternable material where areas that are not exposed are later washed away during development. Thus, if a phosphor such as YAG:Ce is mixed with a silicone material of this type, and the appropriate wavelength of UV light is selected, for example, to provide low absorption of the phosphor and low reflection, the formation of a vertical LED structure with a blue LED and yellow coating can provide a "white" LED. Additionally, multiple phosphors can be used for better color rendering. It will be understood that as used herein "vertical" means a general direction that is perpendicular to the face 110a, 110a' of a semiconductor light emitting element 110, 110'.

In some embodiments of the present invention, the coating including phosphor on the semiconductor light emitting element can provide better Correlated Color Temperature (CCT) control and can allow packagers to make white devices by using a white chip, as opposed to putting a glob of phosphor in the package while packaging the chip.

Moreover, as was described above in connection with FIG. 8, the photopatternable film comprising transparent silicone 120 may have poor selectivity when developing the pattern, in that some of the exposed region may also wash off. This can be considered an additional desirable feature in some embodiments of the invention. In particular, if too much coating is provided so that the desired optical property is not obtained, this poor selectivity may actually be used to erode away additional material to match the desired color point. This eroding away may be performed at the wafer level and/or at the die level. Moreover, as was described above, depending on the wafer/chip geometries, the coating can be performed at the wafer level and/or after dicing on a blue tape.

Accordingly, some embodiments of the present invention can allow a manufacturer of a semiconductor light emitting device to open up the wire bond location while coating the rest of the light emitting wafer or chip, so that a vertical geometry may be used. The patternable material also may be used as a solder mask in that it fits the temperature limits that are desired for die attach. Also, due to the poor selectivity of the developing nature (i.e., erosion of the material that should not be soluble in the developer), this feature can be used to tune in the color point.

Finally, as was described above, coating operations according to embodiments of the present invention may be performed at the wafer level, at the wafer level after probing and testing and/or at the stretched tape level. At the wafer level, the wafer may be coated, initially cured, exposed and developed to open up bond pads, and, optionally, dicing streets. An optional final cure may then be performed followed by wafer probing, dicing, sorting and packaging. Moreover, if a final cure has not been performed at the wafer level, the wafer may be diced, picked and tested, and material may be selectively removed to adjust the color point that was described in connection with FIG. 8. A final cure then may be performed at the die level followed by sorting and packaging. At the stretched tape level, a partial stretch may be performed after dicing, after which coating, curing, exposure and developing may be performed, followed by picking, testing and sorting as was already described.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a semiconductor light emitting device comprising:
    coating a photopatternable film comprising phosphor on at least a portion of a light emitting surface of a semiconductor light emitting element;
    selectively exposing the photopatternable film comprising phosphor to define an aperture therein that exposes a portion of the light emitting surface;
    developing the photopatternable film comprising phosphor that has been exposed, to form the aperture therein that exposes the portion of the light emitting surface;
    measuring light emission of the light emitting device; and
    again developing the photopatternable film comprising phosphor that has been developed, to enlarge the aperture, if the light emission of the light emitting device that is measured does not conform to at least one predefined parameter.

2. A method according to claim 1 further comprising:
    forming a bond pad on the exposed portion of the light emitting surface in the aperture.

3. A method according to claim 2 further comprising:
    bonding a wire to the bond pad opposite the light emitting surface.

4. A method according to claim 1 wherein the light emitting surface includes a face and a sidewall that extends from the face, and wherein coating comprises coating the photopatternable film comprising phosphor on at least a portion of the face and on at least a portion of the sidewall.

5. A method according to claim 4 wherein coating comprises coating the photopatternable film comprising phosphor thicker on the at least a portion of the sidewall than on the at least a portion of the face.

6. A method according to claim 5 wherein coating comprises coating the photopatternable film comprising phosphor at least 10% thicker on the at least a portion of the sidewall than on the at least a portion of the face.

7. A method according to claim 1 wherein the phosphor is configured to convert at least some light that is emitted from the light emitting surface such that light that emerges from the semiconductor light emitting device appears as white light.

8. A method according to claim 1 wherein the at least one predefined parameter comprises an emission frequency spectrum.

9. A method according to claim 1 wherein coating is preceded by:
    coating a patternable film that is free of phosphor on at least a portion of the light emitting surface.

10. A method according to claim 1 wherein coating comprises:
    coating a transparent photopatternable film comprising phosphor on at least a portion of light emitting surfaces of a plurality of semiconductor light emitting elements that are monolithically integrated.

11. A method according to claim 1 wherein the photopatternable film comprising phosphor is a first photopatternable film comprising a first phosphor, the method further comprising:
    coating a second photopatternable film comprising a second phosphor on the first photopatternable film comprising a first phosphor.

12. A method according to claim 11 wherein the first phosphor comprises a green phosphor and the second phosphor comprises a red phosphor.

13. A method of fabricating a plurality of semiconductor light emitting devices comprising:
    mounting a plurality of semiconductor light emitting devices including corresponding light emitting surfaces, on a mounting tape;
    stretching the mounting tape to define spaces between adjacent semiconductor light emitting devices; and
    coating a patternable film comprising phosphor on at least a portion of the light emitting surfaces of the plurality of semiconductor light emitting elements that are mounted on the mounting tape and on the spaces between adjacent semiconductor light emitting devices.

14. A method according to claim 13 wherein the semiconductor light emitting surfaces include sidewalls and wherein coating comprises:
    coating a patternable film comprising phosphor on at least a portion of the light emitting surfaces of the plurality of semiconductor light emitting elements that are mounted on the mounting tape and on the spaces between adjacent semiconductor light emitting devices so as to coat at least a portion of sidewalls of the semiconductor light emitting elements with the patternable film comprising phosphor.

15. A semiconductor light emitting device fabrication apparatus configured to perform the method of claim 1.

16. A method according to claim 1 wherein the photopatternable film comprises transparent silicone and phosphor.

17. A semiconductor light emitting device fabrication apparatus configured to perform the method of claim 13.

18. A method according to claim 13 wherein the photopatternable film comprises transparent silicone and phosphor.

19. A method according to claim 13 wherein mounting a plurality of semiconductor light emitting devices including corresponding light emitting surfaces, on a mounting tape comprises:
    mounting a wafer that includes the plurality of semiconductor light emitting devices therein, including the corresponding light emitting surfaces, on a mounting tape; and
    wherein the following is performed between the mounting a wafer that includes the plurality of semiconductor light emitting devices therein and the stretching the mounting tape to define spaces between adjacent semiconductor light emitting devices:
        dicing the wafer to singulate the plurality of semiconductor light emitting devices.

* * * * *